United States Patent [19]
Koide et al.

[11] Patent Number: 5,550,083
[45] Date of Patent: Aug. 27, 1996

[54] PROCESS OF WIREBOND PAD REPAIR AND REUSE

[75] Inventors: Masateru Koide; Yasuo Kawamura, both of Kawasaki, Japan

[73] Assignee: Fujitsu Limited, Kawasaki, Japan

[21] Appl. No.: 405,015

[22] Filed: Mar. 16, 1995

Related U.S. Application Data

[62] Division of Ser. No. 255,730, Jun. 7, 1994, Pat. No. 5,455,461, which is a continuation of Ser. No. 947,482, Sep. 21, 1992, abandoned.

[51] Int. Cl.$^6$ .................... H01L 21/283; H01L 21/603
[52] U.S. Cl. .................... 437/183; 437/923; 228/180.5; 228/904
[58] Field of Search .................... 437/183, 923; 228/180.5, 904

[56] References Cited

U.S. PATENT DOCUMENTS

| | | | |
|---|---|---|---|
| 3,629,669 | 12/1971 | Kauppila | 317/235 |
| 4,067,104 | 1/1978 | Tracy | 29/626 |
| 4,259,367 | 3/1981 | Dougherty, Jr. | 427/96 |
| 4,415,606 | 11/1983 | Cynkar | 427/90 |
| 4,683,652 | 8/1987 | Hatfield | 29/829 |
| 4,747,889 | 5/1988 | Nishio et al. | 148/437 |
| 4,875,618 | 10/1989 | Hasegawa et al. | 228/179 |
| 4,923,521 | 5/1990 | Liu et al. | 134/5 |
| 5,164,814 | 11/1992 | Okumura | 257/390 |
| 5,181,317 | 1/1993 | Nishihara et al. | 29/401.1 |
| 5,288,607 | 2/1994 | Interrante et al. | 228/119 |
| 5,391,516 | 2/1995 | Wojnarowski et al. | 437/174 |
| 5,397,997 | 3/1995 | Tuckerman et al. | 324/754 |

FOREIGN PATENT DOCUMENTS 1209736  8/1989  Japan .

*Primary Examiner*—George Fourson
*Assistant Examiner*—David E. Graybill
*Attorney, Agent, or Firm*—Armstrong, Westerman, Hattori, McLeland & Naughton

[57] ABSTRACT

A wire bonding method comprising the steps of (a) disconnecting a first wire which is bonded on a first pad which is provided on a substrate, (b) forming a second pad on the first pad, and (c) bonding a second wire on the second pad, so that the second wire is electrically connected to the first pad. The step (a) may completely remove the first wire from the first pad, and the step (b) may form the second pad at least on a top surface of the first pad including a part which is damaged by the removal of the first wire. On the other hand, the step (a) may cut the first wire so that a tip end of the first wire remains bonded on the first pad, and the step (b) may form the second pad at least on a top surface of the first pad so as to completely cover the remaining tip end of the first wire.

10 Claims, 8 Drawing Sheets

(a)

PROCESS OF WIREBOND PAD REPAIR AND REUSE

This is a divisional of application Ser. No. 08/255,730 filed Jun. 7, 1994, U.S. Pat. No. 5,455,461, which is a continuation of Ser. No. 07/947,482, filed Sep. 21, 1992, now abandoned.

BACKGROUND OF THE INVENTION

The present invention generally relates to wire bonding methods and semiconductor devices produced using the wire bonding methods, and more particularly to a wire bonding method which disconnects a wire which is once bonded to a pad on a substrate and newly bonds another wire on the pad and to a semiconductor device which is subjected to such a wire bonding process and has a reformed pad.

FIG. 1 shows an example of a substrate on which electronic parts such as semiconductor elements are mounted. For example, a substrate 1 is made of a ceramic material, and bonding pads 22 are provided on a surface 1A of the substrate 1. An electronic part 20 is mounted on the substrate 1 by fixing input/output pins 21 of the electronic part 20 on the bonding pads 22. On the other hand, a draw-out pad 2A is connected to the bonding pad 22, and surface pattern 23 is provided between the draw-out pad 2A and an inner layer pattern 24. Signals input/output with respect to the input/output pin 21 are transferred via the inner layer pattern 24, the surface pattern 23, the draw-out pad 2A and the bonding pads 22.

The signals which are input/output with respect to the input/output pins 21 may be changed if a modification is made in a circuit network formed in the electronic part 20. In such a case, a modification is made to change the connections so as to switch the signals which are input/output with respect to the input/output pins 21. Generally, such the modification is made by providing a wire 4-2 between a draw-out pad 2A and a relay pad 2B which is already connected to a wire 4-1, and a predetermined part of the surface pattern 23 is cut so that another signal is input/output with respect to the input/output pin 21 via the wire 4-2.

The wire 4-2 may be removed by a further modification, and still another signal may be input/output with respect to the input/output pin 21 by newly providing a wire 5-1 as indicated by a dotted line in FIG. 1. In this case, the wire 4-2 which is already bonded to the draw-out pad 2A is removed, and the wire 5-1 is newly bonded to the draw-out pad 2A.

However, the connections of the draw-out pad 2A and the relay pad 2B with the wires 4-1, 4-2 and 5-1 are normally made by a wire bonding which requires heating. As a result, a thermal stress is introduced in the substrate 1 when the connections of the plurality of wires 4-1, 4-2 and 5-1 are changed. For this reason, it is desirable that the wire bonding is made using minimum heating with respect to the substrate 1.

Conventionally, a reflow bonding process is carried out as shown in FIG. 2(a), (b) and (c).

As shown in FIG. 2(a), a pad 2 which corresponds to the draw-out pad 2A and the relay pad 2B described above is formed on the surface 1A of the substrate 1. The pad 2 is made up of a conductor material 2-1 such as copper, and a gold plating layer 2-2 which covers the conductor material 2-1. For example, the pad 2 has a thickness of approximately 20 to 30 μm and a size of approximately 250 μm×250 μm.

A first wire 4 which corresponds to the wires 4-1 and 4-2 described above is bonded to the pad 2.

The first wire 4 is made of a gold line having a diameter of approximately 50 to 60 μm or, a gold plated copper line. The first wire 4 is bonded to the pad 2 as shown in FIG. 3.

As shown in FIG. 3, a bonding chip 32 which is provided on an arm 31 vibrated by a vibrating mechanism 30 makes contact with the first wire 4 at a bonding part 35 where the first wire 4 rests on the pad 2. The bonding part 35 is pushed by the bonding chip 32 with a predetermined pressure P, and a laser beam 33 which is converged by an optical lens 34 is irradiated on the bonding part 35. Hence, the bonding part 35 is vibrated and heated, so that the first wire 4 is bonded to the pad 2 by diffusion bonding.

When a second wire 5 which corresponds to the wire 5-1 described above needs to be newly connected to the pad 2, an external force is applied on the first wire 4 in a direction C in FIG. 2(b) so as to disconnect the first wire 4 from the pad 2. Thereafter, the second wire 5 is bonded to the pad 2 similarly as when the first wire 4 is bonded to the pad 2, as shown in FIG. 2(c).

However, when disconnecting the wire 4 from the pad 2, the surface of the pad 2 becomes damaged at a part B shown in FIG. 2(b). For this reason, when bonding the second wire 5 to the pad 2 having the damaged surface, there was a problem in that the second wire 5 may not be satisfactorily connected to the pad 2. In other words, the second wire 5 may easily disconnect from the pad 2 after the bonding, and in extreme cases, it may be impossible to satisfactorily bond the second wire 5 on the damaged surface of the pad 2. In such extreme cases, it was conventionally necessary to remove the pad 2 in its entirety and thereafter form a new pad so that the second wire 5 may be positively bonded on the new pad. But the removal of the pad 2 and the formation of the new pad in place of the pad 2 required troublesome operations which must be carried out by a skilled person, and the production yield was poor.

SUMMARY OF THE INVENTION

Accordingly, it is a general object of the present invention to provide a novel and useful wire bonding method and a semiconductor device produced using the wire bonding method, in which the problems described above are eliminated.

Another and more specific object of the present invention is to provide a wire bonding method comprising the steps of (a) disconnecting a first wire which is bonded on a first pad which is provided on a substrate, (b) forming a second pad on the first pad, and (c) bonding a second wire on the second pad, so that the second wire is electrically connected to the first pad. According to the wire bonding method of the present invention, it is unnecessary to completely remove the first pad in order to bond the second wire in place of the first wire. Further, because the second wire is bonded on the second pad which includes no damaged surface, it is possible to positively bond the second wire on the second pad.

Still another object of the present invention is to provide the wire bonding method described above wherein the step (a) cuts the first wire so that a tip end of the first wire remains bonded on the first pad, and the step (b) forms the second pad at least on a top surface of the first pad so as to completely cover the remaining tip end of the first wire. According to the wire bonding method of the present invention, it is unnecessary to completely remove the first wire from the first pad. In addition, compared to completely removing the first wire from the first pad, simply cutting the first wire does not require the skills of an experienced person.

A further object of the present invention is to provide a semiconductor device comprising a substrate, a first pad provided on the substrate and having a top surface which includes a damaged part caused by removal of a first wire originally bonded on the top surface of the first pad, a second pad formed on at least the top surface of the first pad and electrically connected to the first pad, and a second wire which is bonded on the second pad.

Another object of the present invention is to provide a semiconductor device comprising a substrate, a first pad provided on the substrate and having a top surface, a wire portion bonded on the top surface of the first pad, the wire portion being a portion of a first wire which is originally bonded on the top surface of the first pad, a second pad formed on at least the top surface of the first pad and completely covering the wire portion so that the second pad is electrically connected to the first pad, and a second wire which is bonded on the second pad.

Other objects and further features of the present invention will be apparent from the following detailed description when read in conjunction with the accompanying drawings.

DESCRIPTION OF THE PREFERRED EMBODIMENTS

First, a description will be given of a first aspect of the present invention, by referring to FIG. 4.

Figure 4A:
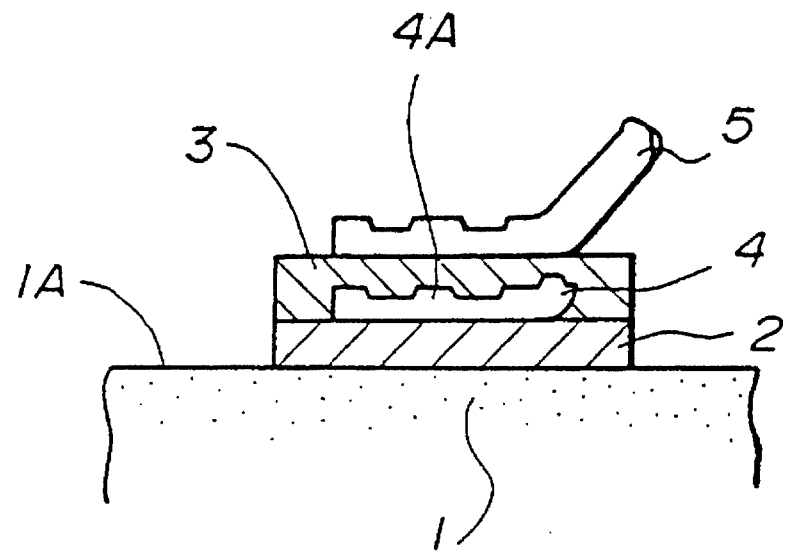
FIGS. 4(a)–4(b) are cross sectional views for explaining a first aspect of the present invention.

As shown in FIG. 4(a), a first pad 2 is provided on a surface 1A of a substrate 1, and a first wire 4 is initially bonded on the first pad 2. This first wire 4 is cut, and a tip end 4A of the first wire 4 remains bonded on the first pad 2. In this state, a second pad 3 is formed on top of the tip end 4A, so as to make electrical contact with the first pad 2. The second pad 3 makes contact with the top surface of the first pad 2 in FIG. 4(a), but may also make contact with side surfaces of the first pad 2. A second wire 5 is newly bonded on the second pad 3 by diffusion bonding.

Figure 4B:
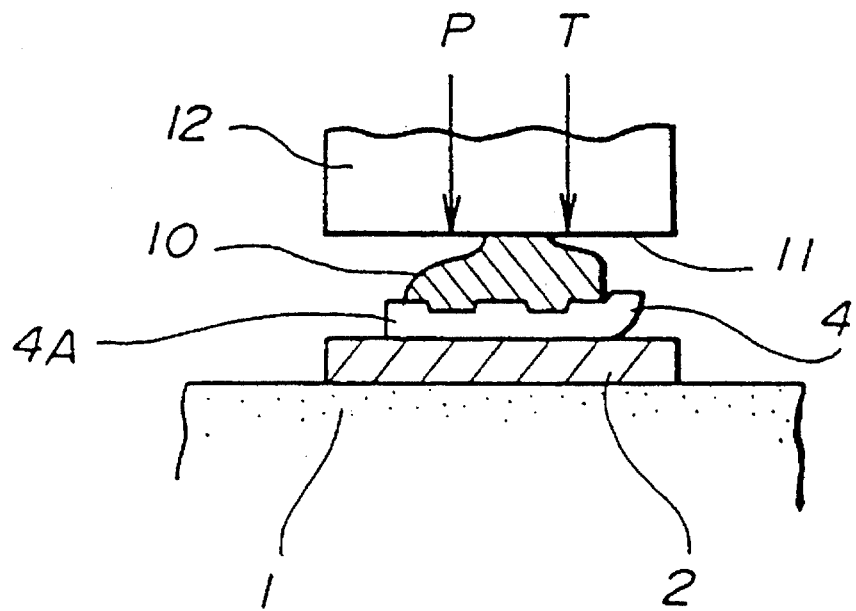

The second pad 3 may be formed as shown in FIG. 4(b). That is, a bump 10 is formed on the first pad 2 so as to cover the tip end 4A of the first wire 4. Then, the bump 10 is heated as indicated by T and subjected to pressure as indicated by P by a punch 12 which has a flat surface 11.

Next, a description will be given of a second aspect of the present invention, by referring to FIG. 5.

Figure 5A:
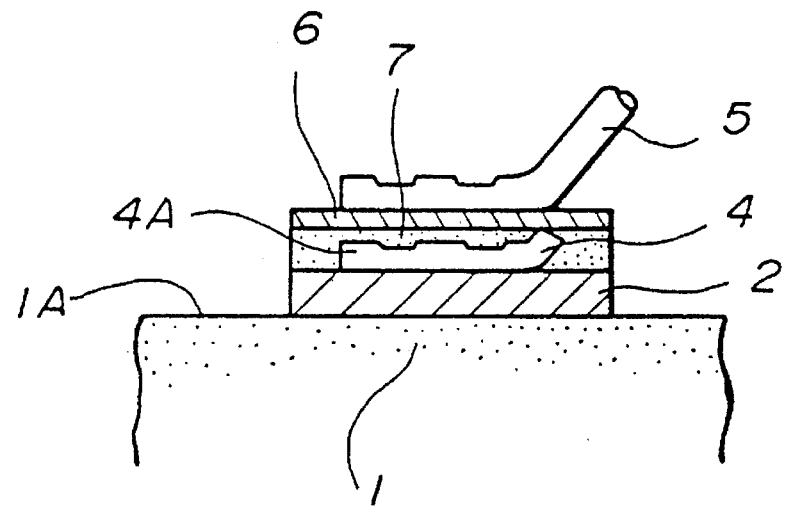
FIGS. 5(a)–5(b) are cross sectional views for explaining a second aspect of the present invention.

As shown in FIG. 5(a), a first pad 2 is provided on a surface 1A of a substrate 1, and a first wire 4 is initially bonded on the first pad 2. This first wire 4 is cut, and a tip end 4A of the first wire 4 remains bonded on the first pad 2. In this state, a second pad 6 is formed on top of the tip end 4A via a solder 7, so as to make electrical contact with the first pad 2. The solder 7 makes contact with the top surface of the first pad 2 in FIG. 5(a), but may also make contact with side surfaces of the first pad 2. A second wire 5 is newly bonded on the second pad 6 by diffusion bonding.

Figure 5B:
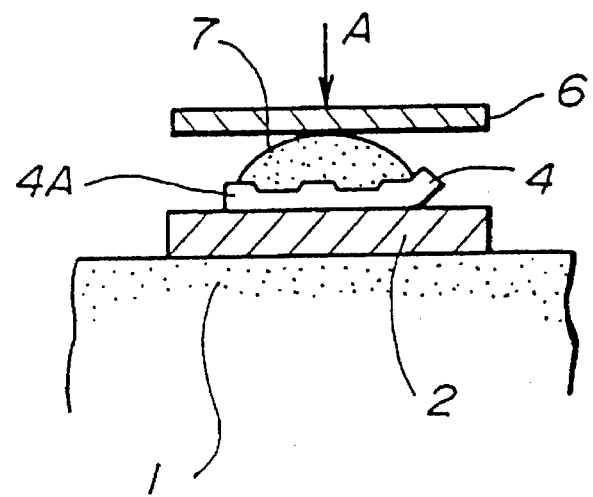

The second pad 6 may be formed as shown in FIG. 5(b). That is, the solder 7 is melted so as to cover the tip end 4A of the first wire 4 on the first pad 2, and the second pad 6 is provided on the solder 7 and pushed in a predetermined direction A so as to maintain a horizontal position. The second pad 6 is formed as shown in FIG. 5(a) when the solder 7 hardens.

According to the first and second aspects of the present invention, there is no need to remove the first wire 4 and it is simply necessary to cut the first wire 4. The tip end 4A of the first wire 4 may remain on the first pad 2. Because the second wire 5 is bonded on the second pad 3 or 6 which is formed on the first pad 2 over the tip end 4A, it is possible to positively bond the second wire 5 on the second pad 3 or 6 and the reliability of the connection is improved. Further, there is no need to remove the first pad 2 before newly bonding the second wire 5.

Figure 1:
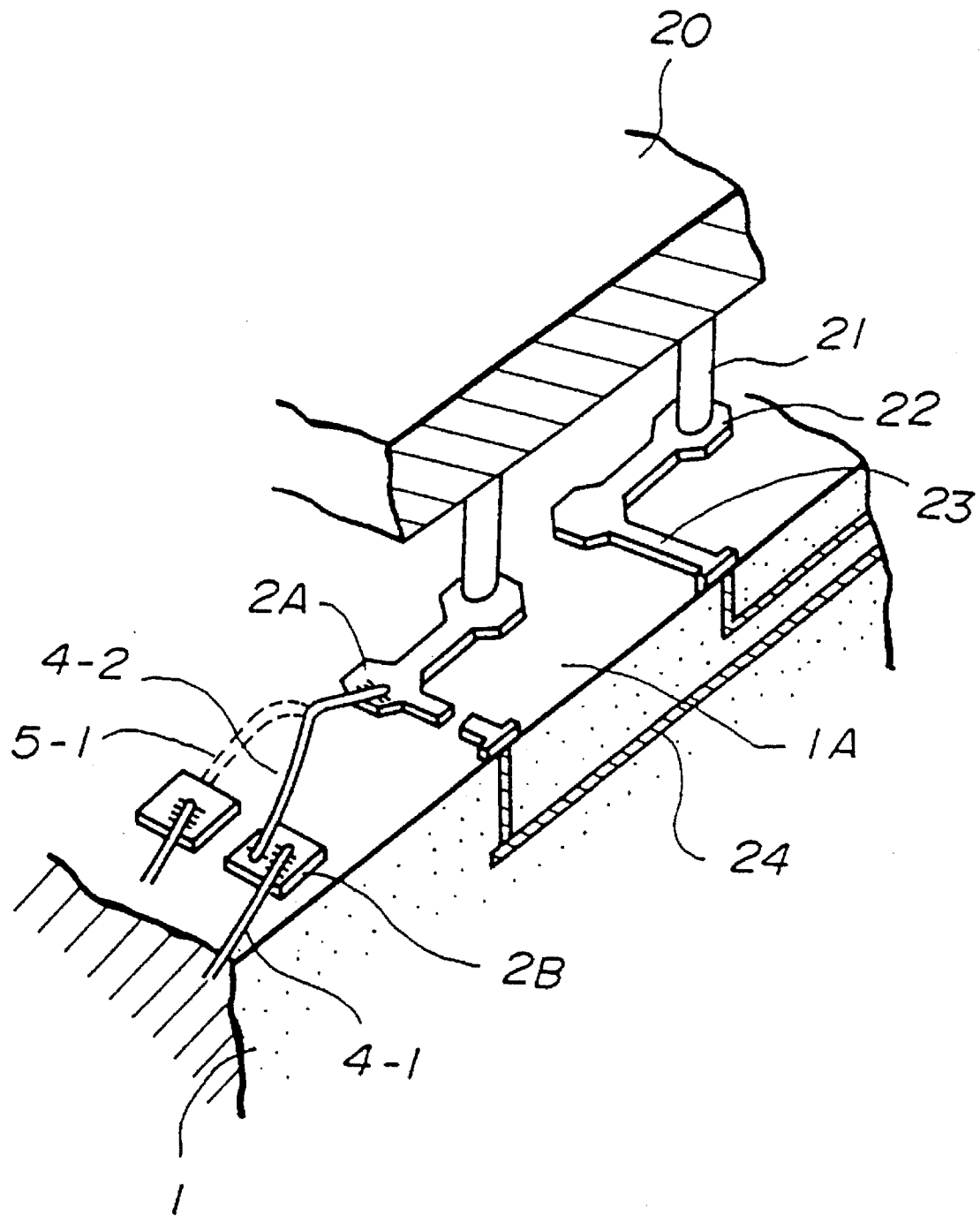
FIG. 1 is a perspective view showing an example of a conventional semiconductor device.
Figure 2:
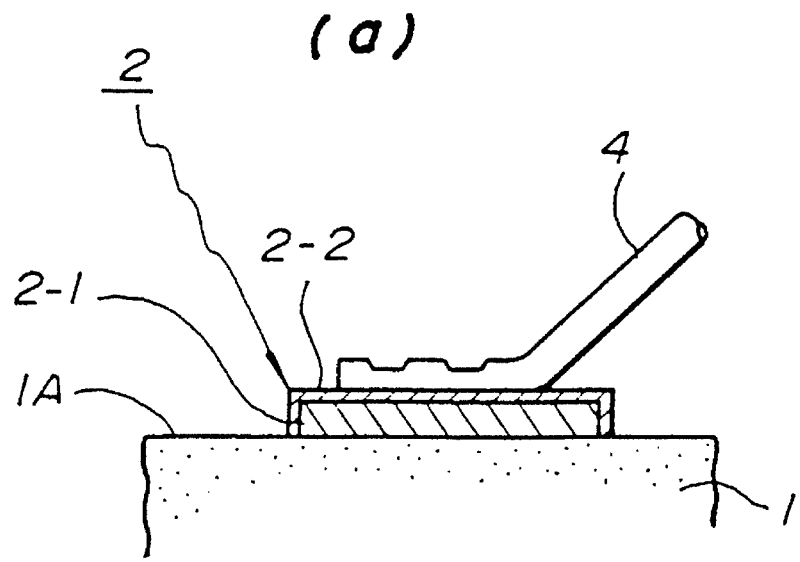
FIGS. 2(a)–(c) are cross sectional views for explaining a conventional reflow bonding process.
Figure 2B:
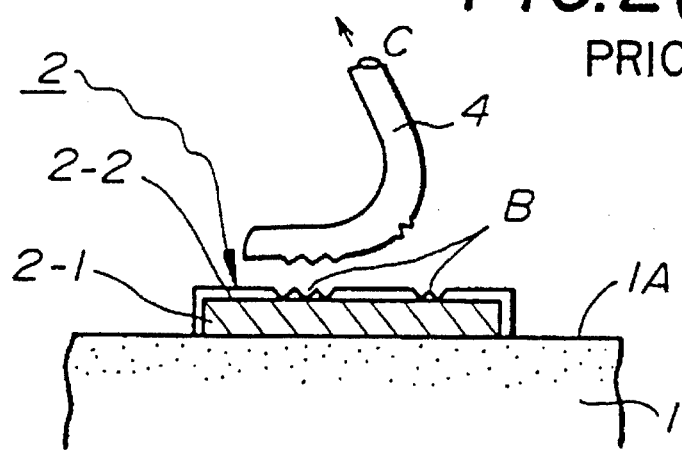
Figure 2C:
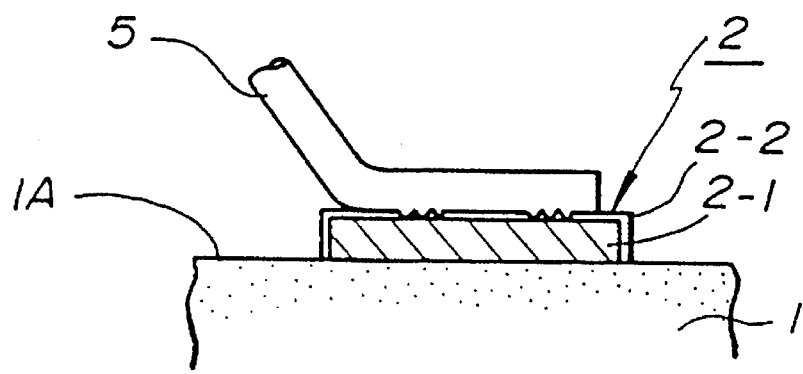
Figure 3:
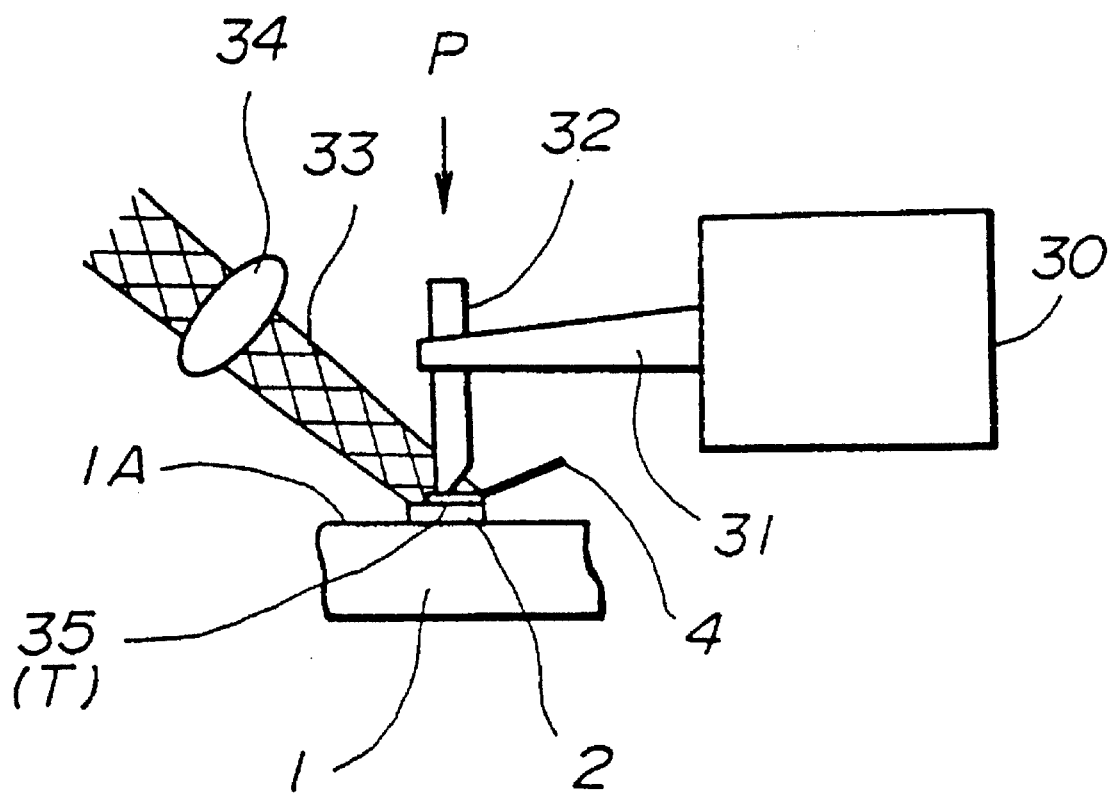
FIG. 3 is a diagram for explaining a conventional process of bonding a wire on a pad.

Of course, according to a third aspect of the present invention, it is possible to completely remove the first wire 4 on the first pad 2 before forming the second pad 3 or 6. In this case, although the top surface of the first pad 2 becomes damaged as described above in conjunction with FIG. 2(b), the second wire 5 can be bonded satisfactorily on the second pad 3 or 6 which is newly formed on the damaged first pad 2. Compared to cutting the first wire 4, it may be necessary to rely on a skilled person to completely remove the first wire 4 without damaging other parts of the semiconductor device, but there is no need to remove the first pad 2 before newly bonding the second wire 5.

Next, a description will be given of a first embodiment of a wire bonding method according to the present invention, by referring to FIG. 6. This embodiment of the wire bonding method produces a first embodiment of a semiconductor device according to the present invention. In FIG. 6, those parts which are the same as those corresponding parts in FIG. 4 are designated by the same reference numerals, and a description thereof will be omitted.

Figure 6A:
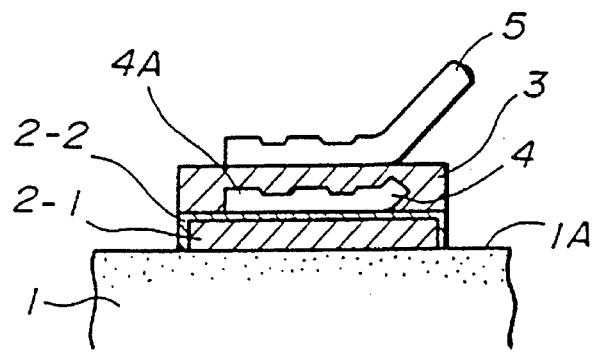
FIGS. 6(a) and 6(b1)–6(b6) are cross sectional views for explaining a first embodiment of a wire bonding method according to the present invention.
Figure 6:
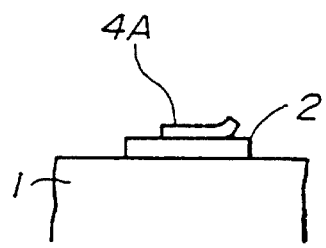
Figure 6:
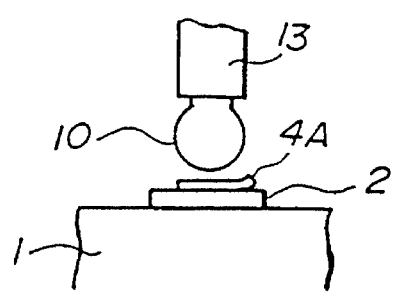
Figure 6:
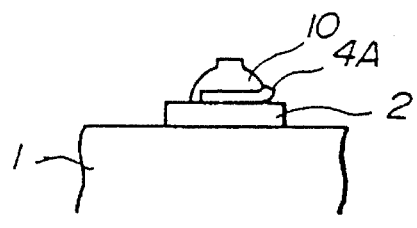
Figure 6:
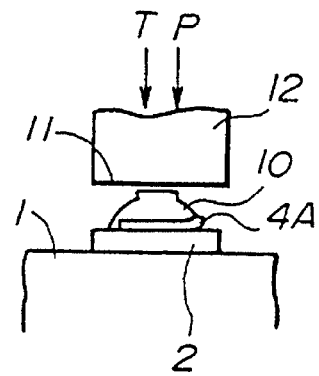
Figure 6:
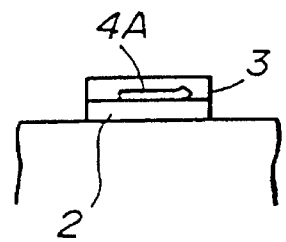
Figure 6:
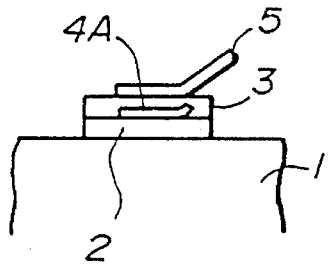

The first embodiment of the semiconductor device according to the present invention has a pad structure shown in FIG. 6(a). In FIG. 6(a), the first pad 2 is provided on the surface 1A of the substrate 1A by forming a gold plating layer 2-2 on a conductor material 2-2 such as copper. The tip end 4A of the first wire 4 remains bonded on the surface of the first pad 2, and the second pad 3 covers the tip end 4A and makes electrical contact with the first pad 2. The second wire 5 is newly bonded on the surface of the second pad 3 by diffusion bonding.

According to this embodiment of the method, the first wire 4 is cut as shown in FIG. 6(b1) when the first wire 4 which is bonded on the first pad 2 is to be switched to the second wire 5. By cutting the first wire 4, the tip end 4A remains bonded on the first pad 2.

Then, the bump 10 which is formed by melting gold by a hand bump tool 13 as shown in FIG. 6(b2), and as a result, the bump 10 is formed on the first pad 2 on which the tip end 4A of the first wire 4 remains as shown in FIG. 6(b3).

Next, as shown in FIG. 6(b4), the bump 10 on the first pad 2 is pressed by the flat surface of the punch 12 and heated. For example, the heating temperature T is approximately 250° C and the pressure P applied by the punch 12 is approximately 5000 to 15000 g/mm$^2$, so that the bump 10 is sufficiently spread and the surface of the bump 10 becomes smooth. By spreading the bump 10 in this manner, the second pad 2 which is formed by the spread bump 10 covers the tip end 4A as shown in FIG. 6(b5).

Finally, as shown in FIG. 6(b6), the tip end of the second wire 5 is positioned on the surface of the second pad 3, and the second wire 5 is bonded on the second pad 2 by diffusion bonding using the bonding chip 32 described above, for example.

Next, a description will be given of a second embodiment of the wire bonding method according to the present invention, by referring to FIG. 7. This embodiment of the wire bonding method produces a second embodiment of the semiconductor device according to the present invention. In FIG. 7, those parts which are the same as those corresponding parts in FIG. 5 are designated by the same reference numerals, and a description thereof will be omitted.

Figure 7A:
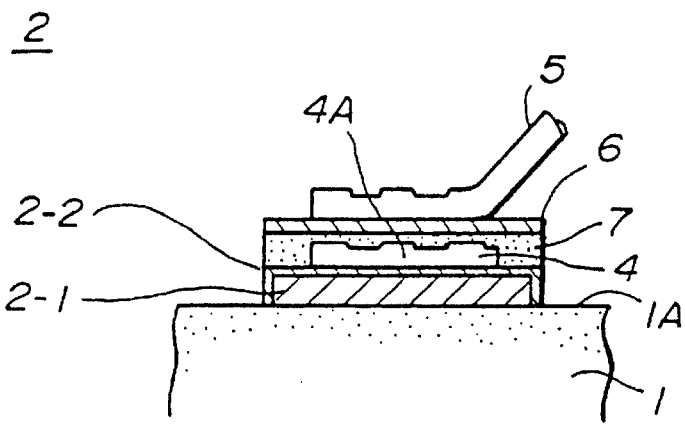
FIGS. 7(a) and 7(b1)–7(b6) are cross sectional views for explaining a second embodiment of the wire bonding method according to the present invention.
Figure 7:
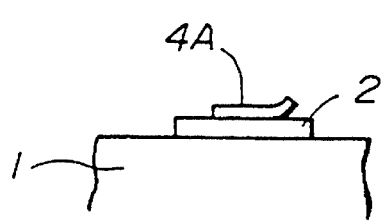
Figure 7:
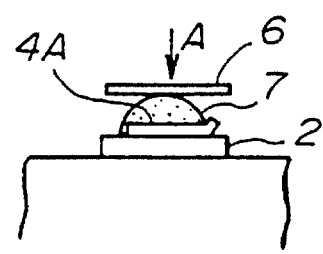
Figure 7:
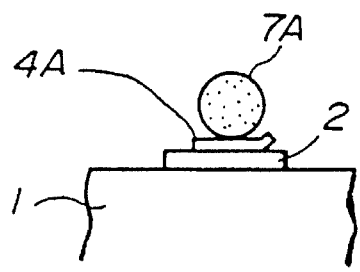
Figure 7:
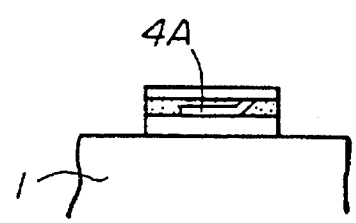
Figure 7:
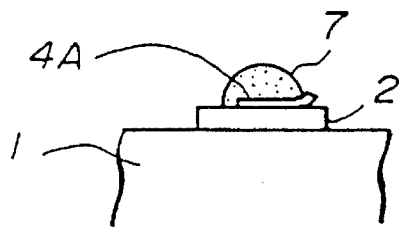
Figure 7:
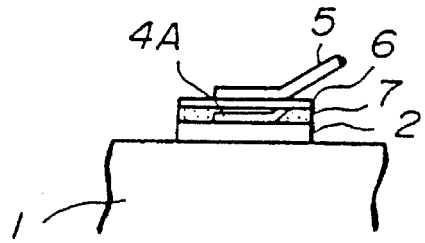

The second embodiment of the semiconductor device according to the present invention has a pad structure shown in FIG. 7(a). In FIG. 7(a), the first pad 2 is provided on the surface 1A of the substrate 1A by forming a gold plating layer 2-1 on a conductor material 2-2 such as copper. The tip end 4A of the first wire 4 remains bonded on the surface of the first pad 2, and the second pad 6 covers the tip end 4A and makes electrical contact with the first pad 2 via the solder 7. The second wire 5 is newly bonded on the surface of the second pad 6 by diffusion bonding.

According to this embodiment of the method, the first wire 4 is cut as shown in FIG. 7(b1) when the first wire 4 which is bonded on the first pad 2 is to be switched to the second wire 5. By cutting the first wire 4, the tip end 4A remains bonded on the first pad 2.

Then, a solder ball 7A is provided on the tip end 4A as shown in FIG. 7(b2), and the solder ball 7A is melted as shown in FIG. 7(b3). In this case, by using the solder ball 7A which includes indium or the like, it becomes possible to lower the melting temperature of the solder ball 7A to approximately 120° C.

Thereafter, as shown in FIG. 7(b4), the second pad 6 is placed on the melted solder ball 7A and the second pad 6 is pushed in the direction A. For example, the second pad 6 may be made of a conductor material plate which is gold plated on the outer periphery thereof, that is, the second pad 6 may have the same construction as the first pad 2. In this state, the melted solder ball 7A is hardened so that the second pad 6 becomes electrically connected to the first pad 2 via the solder 7 as shown in FIG. 7(b5).

Finally, as shown in FIG. 7(b6), the tip end of the second wire 5 is positioned on the surface of the second pad 6, and the second wire 5 is bonded on the second pad 6 by diffusion bonding using the bonding chip 32 described above, for example.

In this embodiment, the second pad 6 is fixed on the first pad 2 via the solder 7. Hence, compared to the first embodiment of the method, it is possible to reduce both the heating temperature T and the pressure P to be applied on the second pad 6. As a result, it is possible to further reduce the undesirable effects of the heating and pressing processes on the substrate 1.

In the first and second embodiments of the method, the heating process may be realized by various methods. Examples of such methods are the method which uses a semiconductor laser, the method which blows a nitrogen gas and the method which heats the entire substrate using fluorine or the like.

In the first and second embodiments of the method, the first wire 4 is cut and the second pad 3 or 6 is formed on the tip end 4A which remains bonded on the first pad 2. However, it is possible to form a second pad after removing the tip end 4A or the first wire 4.

Figure 8:
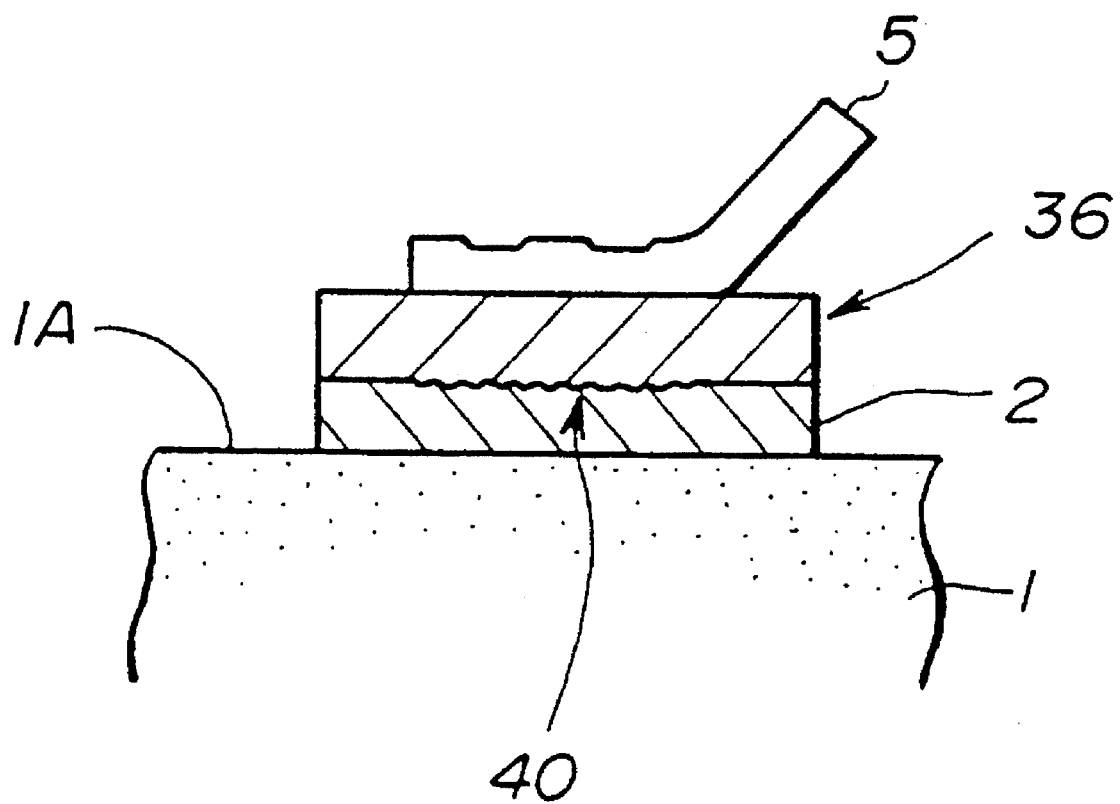
FIG. 8 is a cross sectional view for explaining a third embodiment of the wire bonding method according to the present invention.

FIG. 8 shows the pad structure of a third embodiment of the semiconductor device according to the present invention which is produced by a third embodiment of the wire bonding method according to the present invention. In FIG. 8, those parts which are the same as those corresponding parts in FIGS. 6 and 7 are designated by the same reference numerals, and a description thereof will be omitted.

When the tip end 4A or the first wire 4 is completely removed from the first pad 2, the surface of the first pad 2 becomes damaged as described above in conjunction with FIG. 2(b). In FIG. 8, a damaged part 40 corresponds to the surface damage introduced on the surface of the first pad 2 at the part B in FIG. 2(b). In this third embodiment of the method, a second pad 36 is formed on the surface of the first pad 2 which includes the damaged part 40, and the second wire 5 is bonded on the surface of the second pad 36. This second pad 36 may have the structure shown in FIG. 6 or 7. In other words, the second pad 36 may be formed in the same manner as in the case of the first or second embodiment of the method described above. If the structure shown in FIG. 6 is employed for the second pad 36, the second pad 36 is formed by the second pad 3. On the other hand, if the structure shown in FIG. 7 is employed for the second pad 36, the second pad 36 is formed by the solder 7 and the second pad 6.

Further, the present invention is not limited to these embodiments, but various variations and modifications may be made without departing from the scope of the present invention.

What is claimed is:

1. A wire bonding method comprising the steps of:
   (a) disconnecting a first wire which is bonded on a first pad which is provided on a substrate;
   (b) forming a second pad on the first pad; and
   (c) bonding a second wire on the second pad, so that the second wire is electrically connected to the first pad;
   wherein said step (a) completely removes the first wire from the first pad, and said step (b) forms the second pad at least on a top surface of the first pad including a part which is damaged by the removal of the first wire.

2. The wire bonding method as claimed in claim 1, wherein said step (b) forms the second pad by providing a bump on the first pad and spreading the bump by a pressing process so that the spread bump is flattened and forms the second pad which covers the top surface of the first pad.

3. The wire bonding method as claimed in claim 2, wherein said step (b) spreads the bump by a heating process in addition to the pressing process.

4. The wire bonding method as claimed in claim 2, wherein the first pad is made up of a conductive material which is metal plated at least at the top surface of the first pad.

5. The wire bonding method as claimed in claim 1, wherein said step (b) forms the second pad by providing a solder on the first pad, placing a conductor material plate on the solder, pressing the conductor material against the solder in a direction so that the conductor material plate maintains a horizontal position, and hardening the solder.

6. A wire bonding method comprising the steps of:
   (a) disconnecting a first wire which is bonded on a first pad which is provided on a substrate;
   (b) forming a second pad on the first pad; and
   (c) bonding a second wire on the second pad, so that the second wire is electrically connected to the first pad;
   wherein said step (a) cuts the first wire so that a tip end of the first wire remains bonded on the first pad, and said step (b) forms the second pad at least on a top surface of the first pad so as to completely cover the remaining tip end of the first wire.

7. The wire bonding method as claimed in claim 6, wherein said step (b) forms the second pad by providing a bump on the remaining tip end of the first wire and the first pad and spreading the bump by a pressing process so that the spread bump is flattened and forms the second pad which covers the remaining tip end of the first wire and the top surface of the first pad.

8. The wire bonding method as claimed in claim 7, wherein said step (b) spreads the bump by a heating process in addition to the pressing process.

9. The wire bonding method as claimed in claim 7, wherein the first pad is made up of a conductive material which is metal plated at least at the top surface of the first pad.

10. The wire bonding method as claimed in claim 6, wherein said step (b) forms the second pad by providing a solder on the remaining tip end of the first wire and the first pad, placing a conductor material plate on the solder, pressing the conductor material against the solder in a direction so that the conductor material plate maintains a horizontal position, and hardening the solder.

* * * * *